United States Patent [19]
Matsuoka et al.

[11] Patent Number: 5,334,544
[45] Date of Patent: Aug. 2, 1994

[54] METHOD OF MAKING THIN FILM TRANSISTORS

[75] Inventors: Tomizo Matsuoka, Neyagawa; Mamoru Takeda, Hirakata; Ikunori Kobayashi, Sakai, all of Japan

[73] Assignee: Matsushita Electric Industrial Co., Ltd., Osaka, Japan

[21] Appl. No.: 99,460

[22] Filed: Jul. 30, 1993

[30] Foreign Application Priority Data

Dec. 16, 1992 [JP] Japan ................... 4-335720

[51] Int. Cl.⁵ ............................. H01L 21/265
[52] U.S. Cl. .......................... 437/40; 437/235; 437/913; 437/983; 148/DIG. 118
[58] Field of Search .......... 437/40, 983, 913, 199, 437/235; 148/DIG. 116, DIG. 117, DIG. 118, DIG. 150

[56] References Cited

U.S. PATENT DOCUMENTS

| | | | |
|---|---|---|---|
| 4,469,568 | 9/1984 | Kato et al. | 156/655 |
| 5,028,122 | 7/1991 | Hamada et al. | 359/59 |
| 5,087,113 | 2/1992 | Sakono et al. | 359/59 |
| 5,126,283 | 6/1992 | Pintchovski et al. | 437/983 |
| 5,146,301 | 9/1992 | Yamamura et al. | 359/59 |
| 5,279,980 | 1/1994 | Hikichi et al. | 437/40 |

FOREIGN PATENT DOCUMENTS

| | | |
|---|---|---|
| 58-147069 | 9/1983 | Japan . |
| 3-227068 | 10/1991 | Japan . |
| 3274029 | 12/1991 | Japan . |
| 3283540 | 12/1991 | Japan . |

*Primary Examiner*—Tom Thomas
*Assistant Examiner*—Michael Trinh
*Attorney, Agent, or Firm*—Wenderoth, Lind & Ponack

[57] ABSTRACT

A method of making thin film transistors such that the first conductive layer of a thin film transistor is formed with an aluminum system metal having a low electric resistance, and another metal capable of anodic oxidation is deposited to prevent the aluminum system metal from producing hillocks. The metal capable of anodic oxidation and part of the aluminum system metal are changed into an insulator by an anodic oxidation treatment. In all, the gate insulator of the thin film transistor comprises three layers of aluminum oxide, an oxide of the metal capable of anodic oxidation, and silicon nitride. The method makes it possible to form the lower-layer wiring and gate electrode having a low electric resistance and a flawless gate insulator having excellent insulative quality.

4 Claims, 1 Drawing Sheet

METHOD OF MAKING THIN FILM TRANSISTORS

BACKGROUND OF THE INVENTION

1. Field of the Invention

The present invention relates to a method of making thin film transistors that are used in color liquid crystal displays and the like.

2. Description of the Related Art

In general, a semiconductor device using plural thin film transistors and the like employs a multilayered wiring structure. In particular, the active-matrix type liquid crystal display requires at least two layered wirings running in the row and column directions. Further, a large panel of a liquid crystal display requires wiring having a resistance as low as possible to reduce signal delays. In fact, in order to reduce signal delays, aluminum is used for the first conductive layer of the active matrix substrate, i.e. for lower-layer wiring and gate electrodes of thin film transistors. Further, in order to electrically insulate the second conductive layer, i.e. upper-layer wiring and source-drain electrodes, from the first conductive layer and to form a gate insulating layer, an insulating layer is deposited on the lower-layer wiring and gate electrodes. Next, after thin film transistors are formed and particular areas over the gate electrodes are processed, the second conductive layer is formed to complete an array of thin film transistors.

In a matrix array of the above thin film transistors, the greatest problem has been the fact that short-circuits occur between the first conductive layer (lower-layer wiring and gate electrodes) and the second conductive layer (upper-layer wiring and source-drain electrodes). In particular, if aluminum is used for the gate electrodes and lower-layer wiring, projections called hillock are generated in the Al thin film during a heating process such as a dehydration process which is performed at a temperature of about 160° C. during a photolithographic process for forming electrodes and wiring patterns prior to coating resist. This hillock causes short-circuits between the first and second conductive layers, when a composed array of the thin film transistors are driven, after insulators, semiconductive layers, and second conductive layers, i.e. source-drain electrodes and upper-layer wiring, are formed. It is generally observed that hillocks are responsible for the short-circuits by causing cracks in the insulating layer, damaging the uniformity of thickness of the insulating layer, and causing local concentration of electric fields.

In order to solve this problem, it has been proposed to add a small amount of Ta or Ti to aluminum forming gate electrodes. However, although they are effective against hillocks, the electric resistance of the electrodes becomes about five times as high as the pure aluminum electrodes, so that they are not preferable considering the delay of gate signals. Therefore, a method of making lower-layer wiring and gate electrodes that have the electric resistance as low as pure aluminum and do not produce hillocks has been desired.

SUMMARY OF THE INVENTION

An object of the present invention is therefore to provide a method of making thin film transistors which is capable of preventing hillocks from generation during manufacturing process and, thereby, giving high reliability and yield.

Another object of the present invention is to provide a method of making thin film transistors having a gate insulating layer with a high dielectric strength which is capable of preventing short circuits between first and second conductive layers from occurring.

In order to achieve the aforementioned objective, according to one aspect of the present invention, the first conductive layer of a thin film transistor, i.e. lower-layer wiring and a gate electrode, is formed with an aluminum system metal having a low electric resistance, and another metal capable of anodic oxidation is deposited thereon to prevent the aluminum system metal from generating hillocks. Then, after lower-layer wiring and a pattern of the gate electrode are formed by etching, the metal capable of anodic oxidation and part of the aluminum system metal are changed into an insulator by an anodic oxidation treatment. Therefore, in this step, a multiple layer structure composed of thin films of oxides of aluminum and another metal capable of anodic oxidation is formed on top of the lower-layer wiring and gate electrode. Further, as commonly practiced, a thin film of silicon nitride is deposited thereon to complete the gate and the layer-to-layer insulator. In all, the insulator of the thin film transistor comprises three layers of aluminum oxide, an oxide of the metal capable of anodic oxidation, and silicon nitride.

In comparison to a prior insulator consisting of two layers, in which hillocks are produced in the gate electrode and lower-layer wiring, the insulator of the present invention produces no hillock in the lower conductive layer and fewer pinholes in the insulator and effectively prevents short-circuits between the lower-layer wiring and gate electrode and the upper-layer wiring and source-drain electrode, i.e. short-circuits between the gate and the source in general.

The method of making thin film transistors in accordance with the present invention makes it possible to form the lower-layer wiring and gate electrode having a low electric resistance and a flawless gate insulator having an excellent insulative quality. Therefore, the method is suitable for the production of a large array of high-density thin film transistors. At the same time, the method can prevent short-circuits between the lower conductive layer, i.e. the lower-layer wiring and gate electrode, and the upper conductive layer, i.e. the upper-layer wiring and source-drain electrode. For example, the method can be applied to an active matrix array of thin film transistors for a large liquid crystal display, so that short-circuits between gates and sources of the array of thin film transistors can be effectively prevented, and display panels having great reliability can be produced in a high yield.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

The preferred embodiments according to the present invention will be described below with reference to the attached drawings.

Figure 1A:
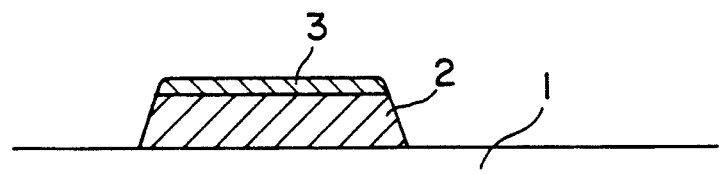
FIGS. 1(a), 1(b) and 1(c) show manufacturing process and cross sections of an inverted staggered thin film transistor at respective stages of the manufacturing process in accordance with the present invention.
Figure 1B:
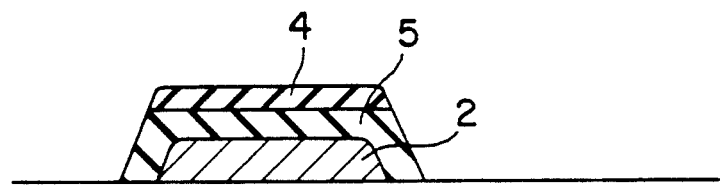
Figure 1C:
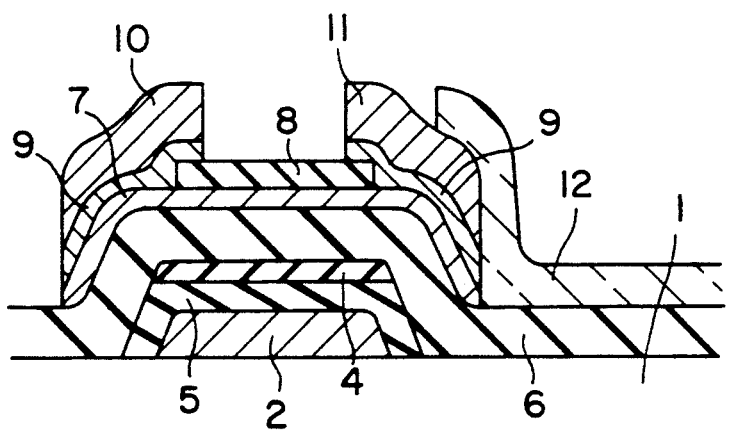

FIGS. 1(a), 1(b) and 1(c) show a manufacturing process and cross sections of inverted staggered thin film transistors on a transparent substrate in accordance with the manufacturing method of the present invention. An insulating layer where upper-layer wiring and lower-layer wiring cross outside the thin film transistor is the same as the insulator of the thin film transistor and is omitted from the figures.

In the first embodiment in accordance with the present invention, pure aluminum or an aluminum metal 2 containing a small amount of impurities such as 0.5% to 2% silicon is, as shown in FIG. 1(a), deposited 200 nm thick on a substrate 1 using a sputtering method. Tantalum 3 is deposited 30 nm thick thereon, and a desired gate pattern is formed using an ordinary dry etching method. In general, when pure aluminum is heated by dehydration in the photolithographic process to a temperature of about 160° C., a projection called hillock is produced on the surface of the thin film of aluminum. If a small amount of silicon is added to the aluminum film, the occurrences of hillocks are reduced, but not sufficiently. If a small amount of tantalum is added in place of silicon, the situation is the same, but not preferable since electric resistance becomes too high in this case. However, if the heavy metal tantalum is deposited more than 30 nm thick on the aluminum thin film as described above, the occurrences of hillocks are effectively reduced. This effect is also realized using other heavy metals Ti, Zr, Nb, W, and Mo. Since these metals are transformed into part of the insulating layer by the anodic oxidation method in the later process, they should be chosen from metals capable of anodic oxidation.

Next, as shown in FIG. 1(b), the whole tantalum and part of the aluminum metal are anodized to form a gate insulator. The anodization is performed with an electrolytic solution of the mixture of an aqueous solution containing 1% tartaric acid and ethylene glycol in the volume ratio of 3:7, adjusted to pH 7 by aqueous ammonia. The 30-nm-thick tantalum becomes thicker by the anodization and transformed into a 75-nm-thick tantalum oxide insulator 4. By controlling the anodization voltage, the aluminum metal is also anodized so that a 100 nm-thick layer 5 of aluminum oxide is formed on the surface of the aluminum metal. In short, a gate insulator composed of an aluminum oxide film and a tantalum oxide film is formed in this step on top of the gate aluminum metal.

Next, as shown in FIG. 1(c), a 225-nm-thick silicon nitride (SiNx) thin film 6, amorphous silicon (a-Si) 7, which becomes the active semiconductor layer, and silicon nitride 8, which becomes an etching stopper, are successively deposited by a plasma-enhanced chemical vapor deposition (PECVD) method. The etching stopper $SiN_x$ is then processed to form an island shape. In the final formation, a 400-nm-thick three-layer gate insulator is composed of a 100-nm-thick aluminum oxide, a 75-nm-thick tantalum oxide, and a 225-nm-thick silicon nitride. Then, in order to obtain ohmic contacts between the amorphous silicon and source-drain metals, amorphous silicon (n+-a-Si) 9 doped with phosphorus as n-type impurities and source-drain metal thin films such as made of titanium (Ti) are deposited. Then, after an opening, which is not shown in the figures, is made to pick up the gate electrode, Ti, n+-a-Si, and a-Si are etched at the same time with the masks of a resist pattern of the source-drain and the etching stopper $SiN_x$, so that a source electrode 10 and a drain electrode 11 are formed as shown in FIG. 1(c). Finally, as shown in FIG. 1(c), a transparent electrode 12 such as indium-tin oxide (ITO) is selectively adhered to allow its electric contacts with the drain electrode, so that the thin film transistor is finished.

In place of Ti, metal silicides such as molybdenum silicide or metal materials such as aluminum, chromium, molybdenum, tantalum, nickel, and nickel-chromium can be used as source-drain electrodes.

The formation of the transparent electrode can be made in an earlier process, and electric contacts with the drain electrode can be made by forming an opening in the insulator.

About 7.37 million thin film transistors made as described above were prepared (24 sheets of 640 × 480 transistor arrays) to examine the defects of short-circuits between the gate and the source. For comparison, the same number of thin film transistors, which have been widely used so far, having a two-layer insulator composed of a 200-nm thick aluminum anodic oxide film and a 200-nm-thick silicon nitride film were also prepared. Following are the results of comparing the number of short-circuits between the gate and the source in these two types of thin film transistors. The rate of the number of the short-circuits in the widely-used transistor arrays to the rate of the number of short-circuits in the transistor arrays of the present embodiment having a three-layer insulator composed of a 100-nm-thick pure aluminum oxide, a 75-nm--thick tantalum oxide, and a 225-nm-thick silicon nitride was 100 to 20. When 1% silicon was added to the aluminum gate of the present embodiment, the ratio of the short-circuit rates was 100 to 13. As is clear from these results, in the thin film transistor arrays made by the method of the present invention, the defects of source-drain short-circuits are reduced to 1/5 to 1/7 of the widely-used thin film transistor arrays. The reduction of the defects is mainly due to the reduction, by the method of present invention, of hillocks that are produced in lower-layer wiring and a gate electrode pattern of an aluminum system caused by heat. Also, the fact that the gate insulator is composed of three layers as opposed to the prior two-layer insulator is supposed to contribute to the reduction of pinholes and defects of the insulator.

In the second embodiment in accordance with the present invention, Ta is deposited 100 nm thick on aluminum. After lower wiring and a gate electrode pattern are formed by a dry etching method, the whole tantalum and the surface of the aluminum film are anodized to form a gate insulator, which is composed of a 100-nm-thick anodic oxide film of aluminum oxide and a 250-nm-thick anodic oxide film of tantalum oxide, into which the 100-nm-thick tantalum film is transformed. Further, a 50-nm-thick silicon nitride film is deposited by the same PECVD method as in the first embodiment, and a 400-nm--thick gate insulator of the same total thickness of the first embodiment is formed. Then a thin film transistor is finished in the same way as of the first embodiment.

As in the first embodiment, arrays of the thin film transistors of the second embodiment were prepared and compared with arrays of the same prior thin film transistors. The result showed that the rate of short-circuits between gates and sources in the second embodiment to the rate of short-circuits in the prior thin film transistors was 10 to 100.

As observed from the above comparison tests, the second embodiment having a 100-nm-thick Ta is more effective than the first embodiment having a 30-nm-thick Ta. However, the silicon nitride that are made contacts with the semiconductor layer requires a thickness of at least 50 nm for the widely designed thickness of 400 nm of the gate insulator. Therefore, the thickness of Ta is preferably less than 100 nm.

In a thin film transistor of the third embodiment in accordance with the present invention, Ta is replaced with another metal capable of anodic oxidation: Ti, Zr, Nb, W, or, Mo. The thickness of each metal film chosen from these metals is made 50 nm, and after anodic oxidation, they are respectively transformed into a 100-nm-thick titanium oxide film, a 100-nm-thick zirconium oxide, a 125-nm-thick niobium oxide, a 150-nm-thick tungsten oxide, and a 150-nm-thick molybdenum. It was confirmed that the additional deposition of one of these metals on top of the aluminum film reduced the occurrences of hillocks.

After anodic oxidation, silicon oxide is deposited so that a 400-nm-thick gate insulator is composed of three layers including a 100-nm-thick anodic film of aluminum oxide. A thin film transistor is finished following the same way as in the first embodiment. The rate of short-circuits between gates and sources in the third embodiment was compared with the rate in the prior thin film transistor as in the first embodiment. The results showed that the rate of short-circuits in case of each replaced metal was less than 35, if the rate of short-circuits of the prior thin film transistor was 100.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A manufacturing method of a thin film transistor which comprises a first conductive layer composed of a conductive material selectively deposited on a transparent insulative substrate, an insulating layer covering the exposed surface of said substrate and said first conductive layer, a semiconductive layer covering a particular surface of said insulating layer, a pair of second conductive layers formed overlapping said semiconductive layer partially, and a transparent conductive layer electrically contacting with one of said second conductive layers, being characterized by forming a first thin film of an aluminum system metal on said transparent insulative substrate as said first conductive layer, forming a second thin film of a metal other than said aluminum system metal on said first conductive layer, said metal being anodic-oxidizable, anodic-oxidizing said thin film of a metal other than said aluminum system and part of said aluminum system metal and, thereby, forming a first insulating layer on said first conductive layer, and depositing a thin film of silicon nitride as a second insulating layer on said first insulating layer, said first and second insulating layers forming said insulating layer covering the exposed surface of said substrate and said first conductive layer.

2. The manufacturing method of a thin film transistor as defined in claim 1 wherein said second thin film is made of a metal chosen from the group consisting of Ta, Ti, Zr, Nb, W, and Mo.

3. The manufacturing method of a thin film transistor as defined in claim 1 wherein said first thin film is made of a metal selected from the group consisting of pure aluminum and aluminum containing a small amount of silicon.

4. The manufacturing method of a thin film transistor as defined in claim 1 wherein the thickness of said second thin film ranges from 30 nm to 100 nm.

* * * * *